United States Patent [19]

Park et al.

[11] Patent Number: 5,891,810
[45] Date of Patent: Apr. 6, 1999

[54] PROCESS FOR SUPPLYING OZONE ($O_3$) TO TEOS-$O_3$ OXIDIZING FILM DEPOSITING SYSTEM

[75] Inventors: Nae-Hak Park, Seoul; Yun-Hee Kim, Chungcheonbuk-do; Young-Jin Song, Seoul, all of Rep. of Korea

[73] Assignee: LG Semicon Co., Ltd., Chungcheongbuk, Rep. of Korea

[21] Appl. No.: 773,175

[22] Filed: Dec. 27, 1996

[30] Foreign Application Priority Data

May 16, 1996 [KR] Rep. of Korea .................. 1996/16458

[51] Int. Cl.⁶ .......................... H01L 21/31; H01L 21/469
[52] U.S. Cl. ............................................. 438/778; 438/787
[58] Field of Search .................................... 438/778, 779, 438/780, 784, 787

[56] References Cited

U.S. PATENT DOCUMENTS 5,288,518  2/1994  Homma ................................. 427/255.1
5,632,868  5/1997  Harada et al. .......................... 204/176

*Primary Examiner*—Charles Bowers
*Assistant Examiner*—Craig Thompson

[57] ABSTRACT

A method and apparatus for controlling the amount of ozone concentration in the layers of a film depositing system and the multi-layered structure produced thereby, whereby the concentration of ozone in each layer gradually changes from a low ozone concentration in the first deposited layer to a high ozone concentration in the last deposited layer.

5 Claims, 1 Drawing Sheet

PROCESS FOR SUPPLYING OZONE ($O_3$) TO TEOS-$O_3$ OXIDIZING FILM DEPOSITING SYSTEM

FIELD OF THE INVENTION

The present invention relates to a TEOS-$O_3$ oxidizing film depositing system. More specifically, the present invention relates to a TEOS-$O_3$ (alkoxysilane) oxidizing film depositing system suitable for improving lower layer dependence and evenness in TEOS-$O_3$ oxidizing film deposition and the process for supplying ozone thereto.

BACKGROUND OF THE INVENTION

In general, the lower layer dependence of a TEOS (tetraethyl ortho-silicate)-$O_3$ oxidizing film is influenced by the content of ozone ($O_3$). To improve the lower layer dependence, the ozone concentration should be suitably adjusted, i.e. a plurality of TEOS-$O_3$ layers should be formed with different ozone concentrations. In other words, it is intended to improve the lower layer dependence and evenness by adjusting the ozone concentration of the TEOS-$O_3$ whereby the layer deposited first has the lowest $O_3$ concentration which is gradually increased in the later deposited TEOS-$O_3$ layers. The "lower layer dependence" of TEOS-$O_3$ film means that the TEOS-$O_3$ film has differences in thicknesses and in quality (density) according to the characteristics of the layers formed on its lower portion. For example, when an oxidation film is formed on the substrate and a poly pattern is formed on a predetermined portion of the oxidation film, if TEOS-$O_3$ is formed on both the oxidation film and the poly pattern, the thickness and the quality (density) of the TEOS-$O_3$ film on the oxidation film are different from that of the TEOS-$O_3$ film formed on the poly pattern. In other words, the TEOS-$O_3$ film is hydrophilic and so is the oxidation film, whereas the poly pattern is hydrophobic. Thus, the TEOS-$O_3$ film has a better characteristic of deposition over the poly pattern rather than over the oxidation film.

A conventional TEOS-$O_3$ oxidizing film depositing system is described with reference to FIG. 1.

FIG. 1 is a block diagram of a conventional TEOS-$O_3$ oxidizing film depositing system.

As can be shown in FIG. 1, the conventional TEOS-$O_3$ oxidizing film depositing system comprises an ozone generating zone 2 which generates ozone from oxygen introduced through a suitable adjusting Mass Flow Controller (MFC) zone 1 and a Mass Flow Controller (MFC) zone 2 which controls the amplitude of the flow. A chamber 3 is provided where the depositing of the TEOS-$O_3$ oxidizing film on a wafer takes place by introducing oxygen and ozone generated in the ozone generating zone 2 as well as a silicon source through opening 3b into the chamber.

The chamber comprises a first inlet opening 3b for introducing the silicon source and depositing the TEOS-$O_3$ oxidizing film on a wafer substrate 3a. A second inlet opening 3c is provided for introducing ozone having a finally adjusted concentration into the chamber. Dispersion head 3d disperses the silicon source and ozone introduced through the first and second inlet openings 3b and 3c on the wafer 3a. A heater 3e is operatively associated with the wafer 3a.

The TEOS-$O_3$ oxidizing film depositing system suitably adjusts the output of the ozone concentration from the ozone generating zone (2) to form a TEOS-$O_3$ oxidizing film layer. The ozone is formed, for example, by the UV radiation of air or oxygen and its concentration can be varied by adjusting the amount of current applied to the UV lamp. The ozone concentration of the oxidizing film layer which is first deposited on the wafer 3a is reduced if the flow of oxygen from the Mass Flow Controller zone 1 increases. Upon gradually reducing the oxygen inflow, the ozone concentration increases accordingly.

However, the conventional TEOS-$O_3$ oxidizing film depositing system described above has the following disadvantages.

First, a long time is required for the ozone concentration to reach a stabilized state, and this shortens the life span of the UV lamp.

Second, if the TEOS-$O_3$ oxidizing film is deposited by using very low ozone concentration in order to remove lower layer dependence due to high ozone concentration, the evenness will deteriorate.

SUMMARY OF THE INVENTION

The object of the present invention is to overcome the above mentioned problems and to provide a TEOS-$O_3$ depositing system which is suitable for enhancing the precise supply and control of ozone concentration and evenness in the film deposition.

Other objects and further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

In order to achieve the above object, the TEOS-$O_3$ oxidizing film depositing system according to the present invention comprises a chamber for accommodating a wafer; a first control zone which controls the amount of $O_2$ being introduced in order to adjust the $O_3$ concentration; an ozone generating zone for generating $O_3$ and supplying $O_2+O_3$ generated in accordance with the amount of $O_2$ introduced in the first control zone; and a second control zone which controls the amount of gas for adjusting the ozone concentration introduced to control the $O_3$ concentration in the $O_2+O_3$ mixture supplied to the chamber from the ozone generating zone. The process for supplying $O_3$ to the TEOS-$O_3$ oxidizing film depositing system thus comprises the steps of preparing $O_2+O_3$ from $O_2$ as a source; adding a gas for controlling the $O_3$ concentration in the $O_2+O_3$ mixture, and supplying the $O_2+O_3$ having the $O_3$ concentration controlled by said gas to the TEOS-$O_3$ oxidizing film depositing system.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION OF PREFERRED EMBODIMENT

The TEOS-$O_3$ oxidizing film depositing system according to the present invention, and the process for supplying $O_3$ thereto are described by referring to the figures attached hereto.

Figure 1:
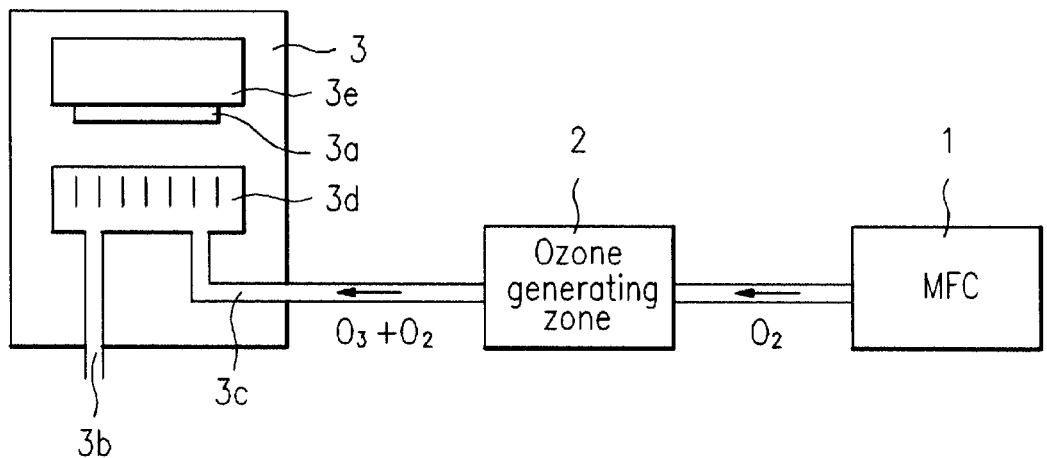
FIG. 1 is a block diagram of a conventional TEOS-$O_3$ oxidizing film depositing system.
Figure 2:
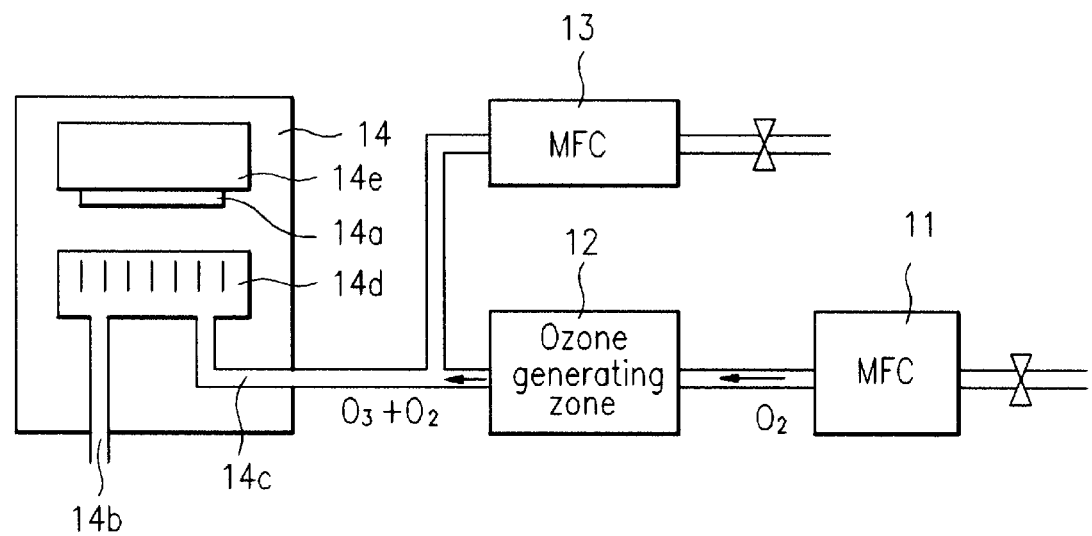
FIG. 2 is a block diagram of a TEOS-$O_3$ oxidizing film depositing system according to the present invention.

FIG. 2 is a block diagram of a TEOS-$O_3$ oxidizing film depositing system according to the present invention. The system comprises a first MFC 11, ozone generating zone 12, a second MFC 13, and a chamber 14.

The chamber comprises a first inlet opening 14b for introducing the silicon source in order to deposit the TEOS-$O_3$ oxidizing film on a wafer 14a; a second inlet opening 14c for introducing ozone in a finally adjusted concentration; a dispersion head 14d which disperses the silicon source and ozone introduced through the first and second inlet openings 14b, 14c on the wafer 14a; and a heater 14e.

The first MFC 11 controls the amount of oxygen introduced into the ozone generating zone 12, thereby providing a first adjustment in the ozone concentration.

The ozone generating zone 12 generates $O_2+O_3$ for introduction to the chamber 14, depending upon the amount of oxygen introduced from the control of the first MFC.

The second MFC 13 provides a second control for controlling the amount of a gas for adjusting the ozone concentration which is secondly introduced to more precisely adjust the ozone concentration in $O_2+O_3$ stream supplied from the ozone generating zone 12 to the chamber 14.

Thus, the first and second gas for adjusting the ozone concentration varies the ozone concentration as the amount of the gas gradually increases, to form a multilayer TEOS-$O_3$ oxidizing film layer.

The gas introduced from the second MFC 13 is selected from the group consisting of oxygen, oxygen+ozone, and other gases which are not reactive with the silicon source.

The amount of finally adjusted $O_3$ to the amount of $O_2+O_3$ supplied to the chamber 14 utilizing the controls of the first and the second Mass Flow Controllers 11, 13 is 0.5 to 7% by weight, and the amount of ozone per unit volume ($O_3/m^3$) is 5 to 120 g.

The process for supplying ozone to the present TEOS-$O_3$ oxidizing film depositing system having the construction described above is set forth hereinbelow.

Figure 3:
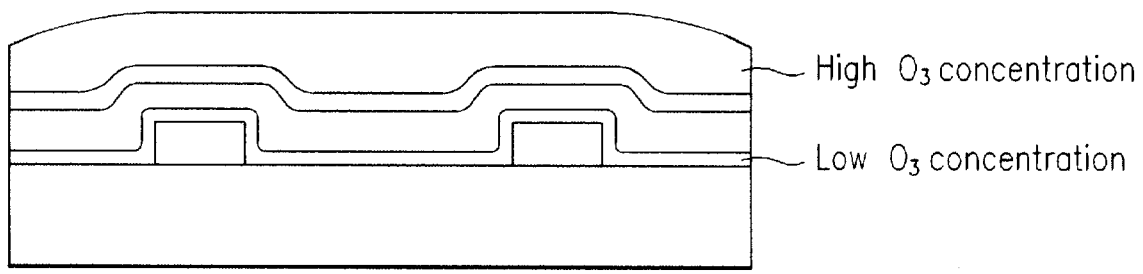
FIG. 3 is a sectional view showing a multi-layer TEOS-$O_3$ film according to the present invention.

FIG. 3 is a sectional view showing the TEOS-$O_3$ oxidizing multi-layer film formed in accordance with the present invention.

As illustrated in FIG. 3, the multi-layer film is first formed by a TEOS-$O_3$ oxidizing film layer having a low ozone concentration followed by TEOS-$O_3$ oxidizing film layers having gradually increasing ozone concentrations, whereby the evenness of the TEOS-$O_3$ oxidizing film is enhanced. In other words, the first MFC 11 primarily controls the amount of oxygen introduced into the ozone generating zone for adjusting the ozone concentration. Thus, the ozone generating zone 12 generates a corresponding amount of ozone depending on the amount of oxygen introduced to the ozone generating zone from the first MFC 11.

Then, the second MFC 13 is used for a more precise adjustment of the ozone concentration. The second MFC 13 introduces a gas for further controlling and adjusting the ozone concentration in ozone+oxygen stream flowing from the ozone generating zone 12 to the chamber 14.

As stated above, the gas used as a second control is selected from the group consisting of oxygen, oxygen+ozone, ozone, and other gases which are not reactive with the silicon source.

Thus, a TEOS-$O_3$ oxidizing film layer having more precise ozone concentrations can be formed in a multi-layer configuration by adjusting the ozone concentration two times to gradually alter the final ozone concentration.

The amount of finally adjusted $O_3$ to the amount of $O_2+O_3$ supplied into the chamber 14 utilizing the control of the first and the second MFC 11, 13 is 0.5 to 7% by weight, and the amount of ozone per unit volume ($O_3/m^3$) is 5 to 120 g.

The TEOS-$O_3$ oxidizing film depositing system and the process for supplying ozone thereto according to the present invention have following effects.

First of all, the ozone concentration can be precisely controlled because the concentration thereof is controlled at least twice.

Secondly, the formation of a TEOS-$O_3$ oxidizing film having multi-layers enables the manufacture of the product with improved evenness.

Thirdly, the life span of the ozone generating zone is prolonged.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process for controlling the concentration of ozone, introduced as an oxidizing agent, to a film depositing system in which an oxidizing film is disposed in layers on a substrate, which comprises:

introducing oxygen in a controlled amount into an ozone-generating zone and recovering a stream therefrom containing ozone and oxygen, introducing a gas, in a controlled amount, into the ozone and oxygen-containing stream to further adjust the concentration of the ozone and form a final ozone-containing stream, and introducing the final ozone-containing stream into the chamber, whereby in depositing a plurality of layers on the substrate, the concentration of ozone in the respective layers can be varied.

2. The process of claim 1, wherein the ozone concentration is controlled to gradually increase from the first layer to be deposited to the last layer to be deposited.

3. The process of claim 1, wherein the gas is selected from the group consisting of oxygen, ozone, and oxygen-ozone, with or without a gas which does not react in the process.

4. The process of claim 1, wherein the ratio of the amount of finally adjusted ozone to the amount of oxygen+ozone supplied to the chamber is 0.5 to 7% by weight (w/o), and the amount of ozone per unit volume ($O_3/m^3$) is 5 to 120 g.

5. The process of claim 1, wherein the oxidizing layer is tetraethyl ortho-silicate-$O_3$.

* * * * *